United States Patent [19]

Langan et al.

[11] Patent Number: 5,413,670
[45] Date of Patent: May 9, 1995

[54] METHOD FOR PLASMA ETCHING OR CLEANING WITH DILUTED $NF_3$

[75] Inventors: John G. Langan, Wescosville; Scott E. Beck, Kutztown; Brian S. Felker, Allentown, all of Pa.

[73] Assignee: Air Products and Chemicals, Inc., Allentown, Pa.

[21] Appl. No.: 89,210

[22] Filed: Jul. 8, 1993

[51] Int. Cl.$^6$ .............................................. B44C 1/22
[52] U.S. Cl. .............................. 134/1.2; 134/902; 156/643.1
[58] Field of Search ............... 156/643, 646; 134/902, 134/1, 21

[56] References Cited

U.S. PATENT DOCUMENTS

| | | | |
|---|---|---|---|
| 4,412,119 | 10/1983 | Komatsu | 219/121 |
| 4,522,681 | 6/1985 | Gorowitz | 156/643 |
| 4,654,112 | 3/1987 | Douglas | 156/643 |
| 4,711,698 | 12/1987 | Douglas | 156/643 |
| 4,904,341 | 2/1990 | Blaugher | 156/643 |
| 4,981,551 | 1/1991 | Palmour | 156/643 |
| 5,000,113 | 3/1991 | Wang | 118/723 |
| 5,209,803 | 5/1993 | Powell | 156/345 |
| 5,286,297 | 2/1994 | Moslehi | 118/723 |

FOREIGN PATENT DOCUMENTS

| | | |
|---|---|---|
| 63-11674 | 1/1988 | Japan. |
| 1194423 | 11/1989 | Japan. |

OTHER PUBLICATIONS

Barkanic, Hoff, Stach, Golja, "Dry Etching Using $NF_3/Ar$ and $NF_3/He$ Plasma" Special Technical Testing Publication 850, 1984, pp. 110–123.

Tan, Goh, Naseem & Brown, "Plasma Etching of Silicon Using NF Diluted w/ Ar, Ni, and $H_2$" Proc. 2nd Int'l. Conf. on Elec. Mats, 1990 pp. 439–444.

Ianno, Greenberg and Verdeyen "Comparison of the Etching & Plasma Characteristics of Discharges in $CF_4$ and $NF_3$" J. Electrochem. Soc. vol. 128, No. 10, pp. 2174–2179.

Chow, Steckl "Plasma Etching of Sputtered Mo & $MoSi_2$ Thin Films in $NF_3$ Gas Mixtures" J. Appl. Phys. vol. 53, No. 8 Aug. 1982 pp. 5531–5540.

Donnelly, Flamm, Dautremont-Smith, Werder, "Anisotropic Etching of $SiO_2$ in Low-Frequency $CF_4/O_2$ and $NF_3/Ar$ Plasma" J. Appl. Phy. 55(1) 1 Jan. 1984, pp. 242–252.

Stenger & Akiki "Kinetics of Plasma Etching Silicon w/ $NF_3$", Mat. Res. Soc. Symp. Proc vol. 68 pp. 267–272.

*Primary Examiner*—R. Bruce Breneman
*Assistant Examiner*—Joni Y. Chang
*Attorney, Agent, or Firm*—Geoffrey L. Chase; William F. Marsh

[57] ABSTRACT

A method has been developed for the removal of silicon nitride and silicon dioxide, or other semiconductor materials from a surface of a wafer or CVD reactor. The method uses $NF_3$, mixed with an electropositive diluent, preferably argon, at a given range of concentration, pressure, flowrate, and power to obtain the fastest possible etch rates. The etch rates of the film being processed can be caused to increase even as the concentration of $NF_3$ in the diluent is decreased by choosing the proper diluent and operating conditions. Not only does this method increase the etch rate, thereby increasing the throughput of the reactor using this process, it also accomplishes this task at low concentrations of $NF_3$ resulting in a lower cost.

8 Claims, 4 Drawing Sheets

Si3N4 etch rates obtained at 60W RF power, 50sccm total gas flowrate.

Figure 1. Schematic of the plasma etching reactor.

Figure 2. SiO2 etch rates obtained at 60W (1.4W/cm2), 50 sccm total gas flowrate Figure 3. Si3N4 etch rates obtained at 60W RF power, 50sccm total gas flowrate.

METHOD FOR PLASMA ETCHING OR CLEANING WITH DILUTED NF3

TECHNICAL FIELD

The present invention is directed to the field of etch-cleaning or removal of semiconductor material, such as films, on deposition equipment or electronic materials substrates using a plasma of low concentration nitrogen trifluoride in a diluent that is more electropositive than nitrogen trifluoride, such as argon.

The present invention is particularly appropriate to the removal of silicon dioxide and silicon nitride at higher etch rates than previously experienced at lower nitrogen trifluoride concentrations than previously utilized.

BACKGROUND OF THE PRIOR ART

Etching and cleaning of $SiO_2$, tungsten, polysilicon and $Si_3N_4$ materials are technologically significant processes for microelectronics device fabrication. Faster etch rates are required to increase the throughput of the process, thus decreasing the total cost.

In most etching processes, diluting the fluorine source gas, $CF_4$, $C_2F_6$, etc. results in a decrease in $SiO_2$ or $Si_3N_4$ etch rates. The $NF_3$ literature reports the same result, diluting the $NF_3$ results in lower etch rates.

Various attempts have been made to use nitrogen trifluoride efficiently in the prior art.

U.S. Pat. No. 4,711,698 describes a plasma etching process for thermally grown or CVD deposited silicon oxide. This work describes selective etching of silicon oxide to silicon and refractory metals and their silicides. The preferred embodiment uses a gas mixture of $BF_3/H_2/Ar$ with the claim that the $BF_3$ gas can be replaced by one of the following: $NF_3$, $SF_6$, or $SiF_4$ Hydrogen is supplied to the reactor in a carrier gas of argon in the concentration of 3% hydrogen to 97% argon. Total flow rates are calculated from the flow rate of the fluorinated gas ($BF_3$, etc.) and the hydrogen flow rate, with the inert gas component disregarded. The inventor claims the percentage in the etchant gas mixture of all atomic species which form in the glow discharge molecules and radicals capable of adsorbing onto and reducing silicon oxides in the range of 5% atomic to 50% atomic of the etchant gas mixture. The pressure range claimed is 100 mTorr to 3 Torr. Also claimed is the atomic ratio of fluorine to hydrogen in the etchant gas mixture in the range of 15:1 to 30:1.

Japanese Unexamined Patent Application 63-11674 is an improved cleaning method for plasma CVD chambers utilizing mixtures of argon and $NF_3$. In particular, $Si_3N_4$ was etched with a 50% mixture (nitrogen trifluoride/argon) at 0.6 Torr. Data shown in this patent application range from 0.3 to 1.0 Torr with 50% dilution.

H. G. Stenger and G. S. Akiki, "Kinetics of Plasma Etching Silicon with Nitrogen Trifluoride," Mat. Res. Soc. Proc. Vol. 68, (1986) pp. 267–272, state that, "A potential drawback from the use of $NF_3$ is its formation of fewer positive ions than $CF_4$ at similar reaction conditions [2]. Fewer positive ions cause $NF_3$ to give predominately isotropic etch profiles [4]." Etching was performed in a Plasma Therm PK-24 radial flow reactor with electrode spacing of 1.57 cm and electrode area of 2450 sq cm (55.8 cm dia.). The reactor pressure was held at 18.7 Pa, electrode temperature was held at 25° C., and mole fraction of $NF_3$ in Ar held at 0.4. Etch rates of silicon (given in micromoles of Si/min) were a linear function of inlet gas flow (from 4 to 24 sccm) with power densities of 0.082, 0.123, 0.163, and 0.204 $W/cm^2$. "As silicon loading is decreased, loss of fluorine atoms in non-etching reactions will become significant relative to those consumed in the etching reaction."

J. Barkanic, A. Hoff, J. Stach, and B. Golja, "Dry Etching Using NF3/Ar and NF3/He Plasmas," Semiconductor Processing, ASTM STP 850, (1984) pp. 110–123, include research in which experiments were performed in a Plasma Therm PK 2440 Dual Plasma/Reactive Ion Etch System with 22 in Dia. electrodes and electrode spacing of 2.6 inches. Helium and argon were used as diluents with the $NF_3$ being varied from 10% to 80% of the total flow (by volume). For plasma etching (PE) experiments a fixed flow of 40 sccm was used and pressure ranged from 60 to 500 microns. For RIE the flow was varied from 10 to 40 sccm and the pressure ranged from 15 to 80 microns. Power densities ranged from 0.02 to 0.8 $W/cm^2$. "At low NF3 concentrations (<40% NF3/inert) the etch rate in either an Ar or He mixture is not significantly different. In addition, the etch rate for low percent NF3 mixtures (10 to 20% NF3/inert) doesn't vary markedly with power density. This indicates that the NF3 concentration in low percentage NF3 mixtures is low enough such that it doesn't result in more NF3 being dissociated as power density is increased." $SiO_2$ etch rates varied from 30 to 1500 A/min depending upon the mode selected. Loading of the chamber was also noted to have an effect on etch rate with the rate decreasing with increasing number of wafers.

V. M. Donnelly, D. L. Flamm, W. C. Dautremont-Smith, and D. J. Werder, "Anisotropic Etching of $SiO_2$ in Low-Frequency CF4/O2 and NF3/Ar Plasmas," J. Appl. Phys., vol. 55, no. 1, (Jan. 1984), pp. 242–252, describe a protocol in which during all experiments gas pressure was 0.35 Torr and total flow rate was 100 sccm. Additionally, three types of electrodes were used: (1) hard anodized aluminum; (2) Stainless steel; and (3) silicon covered stainless steel lower electrodes. "NF3/Ar plasmas generated much higher fluorine atom concentrations than CF4/O2 plasmas . . . The fluorine atom density is ~10 times higher than in CF4/50% O2 under the same conditions (empty stainless-steel reactor, power =0.35 $W/cm^2$, flow rate =100 sccm, and pressure =0.35 Torr)." When the lower electrode was covered with silicon the fluorine atom concentration in the NF3 plasma dropped by a factor of ~6. Their results of etch rate vs. fluorine atom concentration suggest that the same processes are operative in both CF4/O2 and NF3/Ar for SiO2 etching. Additionally, it was found that the higher the percentage of NF3 in the mix, the higher the resulting substrate temperature. Contamination was found to be "less serious" when the stainless steel electrodes were used.

S. M. Tan, H. C. Goh, H. A. Naseem, and W. D. Brown, "Plasma Etching of Silicon Using NF3 Diluted with Argon, Nitrogen, and Hydrogen," Proc. 2nd Int'l. Conf. on Elec. Mats., (1990 Materials Research Society), pp. 439–444, reported that experiments were performed in a single chamber stainless steel PECVD system. The chamber pressure was kept at 250 mTorr, the total flow rate was 10 sccm, and the power was varied from 4 to 20 Watts (0.023 to 0.113 $W/cm^2$). Etch rates were measured by profilometry. It was observed that the sustaining power for NF3 diluted with argon or hydrogen was about half that for dilution with nitrogen.

The authors point out that their etch rate data is in contrast to that of Barkanic (i.e., the etch rates of silicon vs. dilution % peak at different concentrations, with power held constant, and are not linear as in the Barkanic studies). They explain this result by stating ". . . although there is a higher concentration of NF3, the concentration of reactive etching radicals seems to decrease, resulting in a lower etch rate. With constant power applied to the plasma, the fall in the etch rate at higher R [R=NF3 flow rate/(NF3+diluent gas)] can be observed as the operating power for etching gets nearer to the plasma sustaining power. Increasing the concentration further would put the power in the no plasma region . . ." That is, as the concentration of NF3 increases it becomes harder to "light" the plasma, i.e., more power is needed to sustain the plasma.

In their study of NF3/N2 they find that both fluorine and nitrogen play a role in etching silicon. They note that higher powers are needed to sustain the plasma of this type of mixture than for NF3/Ar. The results also indicate that the N-F radical may also etch silicon and result in a higher etch rate than with NF3/Ar. Again they observe a nonlinear relationship between etch rate and NF3 concentration at constant power.

Low etch rates were obtained for the NF3/H2 mixes. They explain this by noting that hydrogen scavenges fluorine. Additionally, material deposition was observed for R=0.4.

The prior art has attempted to use nitrogen trifluoride for various etching processes, but the prior art has not resolved the problem of efficient use of nitrogen trifluoride as the present invention has done in which lower requirements of expensive nitrogen trifluoride at higher etch rates result in shorter down time for semiconductor process equipment, more thorough etch-cleaning with lower utilization of nitrogen trifluoride as will be set forth in greater detail below.

BRIEF SUMMARY OF THE INVENTION

The present invention is a process for plasma removal of semiconductor materials which react with fluorine from a surface which comprises contacting a semiconductor material with a plasma of approximately 10–25% nitrogen trifluoride in a diluent more electropositive than nitrogen trifluoride, at a pressure in the range of approximately 600–1700 mtorr, and a power in the range of approximately 0.4–1.4 W/cm$^2$.

Preferably, the semi conductor material is selected from the group consisting of silicon dioxide, tungsten, polysilicon and silicon nitride.

Preferably, the diluent is selected from the group consisting of nitrogen, helium, argon, nitrous oxide and mixtures thereof.

Preferably, the nitrogen trifluoride is in the range of 10–18%.

Preferably, the pressure is approximately 800–1600 mtorr.

Preferably, the semiconductor material is a film on a substrate.

Preferably, the power is approximately 1.2 W/cm$^2$.

Preferably, the power is at a frequency of approximately 13.56 MHz.

Specifically, the present invention is a process for the removal of silicon dioxide from a surface which comprises contacting a silicon dioxide material with a plasma of approximately 15–25% nitrogen trifluoride in argon, at a pressure in the range of approximately 700–1700 mtorr, and a power in the range of approximately 0.4–1.4 W/cm$^2$.

Alternatively, the present invention is a process for plasma removal of silicon nitride from a surface which comprises contacting a silicon nitride material with a plasma of approximately 10–25% nitrogen trifluoride in argon, at a pressure in the range of approximately 700–1700 mtorr, and a power in the range of approximately 0.4–1.4 W/cm$^2$.

DETAILED DESCRIPTION OF THE INVENTION

The method covered by the present invention is an improved way to remove films which react with fluorine-containing plasmas to form volatile products. In the preferred embodiment of the invention, SiO$_2$ and Si$_3$N$_4$ films are etched using NF$_3$/Ar mixtures at a particular concentration and pressure. We have discovered that improved etch rates can be obtained by using less concentrated NF$_3$ mixtures, in this case 10–25% NF$_3$ in diluent, preferably 15–25% for SiO$_2$ and 10–25% for Si$_3$N$_4$, most preferably 17.6% NF$_3$ in Ar, and operating at elevated pressures, in this case 600–1700 mTorr, preferably 700–1700 more preferably 1550 mTorr (for 50 sccm total gas flow and 60 W or 1.4 W/cm$^2$). Power can range over 0.4 to 1.4 W/cm$^2$ (W=watts). Power is preferably at a frequency of 13.56 MHz. This finding of improved etch rates at low NF$_3$ concentration is important since faster etch rates result in improved throughput for the CVD or plasma etching process. In addition the fastest etch rates are unexpectedly achieved at low NF$_3$ concentrations resulting in a cost savings from reduced NF$_3$ gas usage.

The physical basis for this method results from the unique properties of NF$_3$ plasmas. NF$_3$ can generate a greater free fluorine atom concentration in a plasma than does CF$_4$ or C$_2$F$_6$ under identical conditions. This leads to generally faster etch or clean rates using NF$_3$. However, excess fluorine in a plasma can also be detrimental. Fluorine atoms are extremely electronegative, resulting in a high concentration of negative fluoride ions in the plasma. This leads to a low free electron density which in turn leads to unstable plasmas. The method described here carefully balances these two phenomena. The concentration and pressure are adjusted for a given RF power and total gas flowrate to achieve the fastest possible etch rates.

Figure 1:
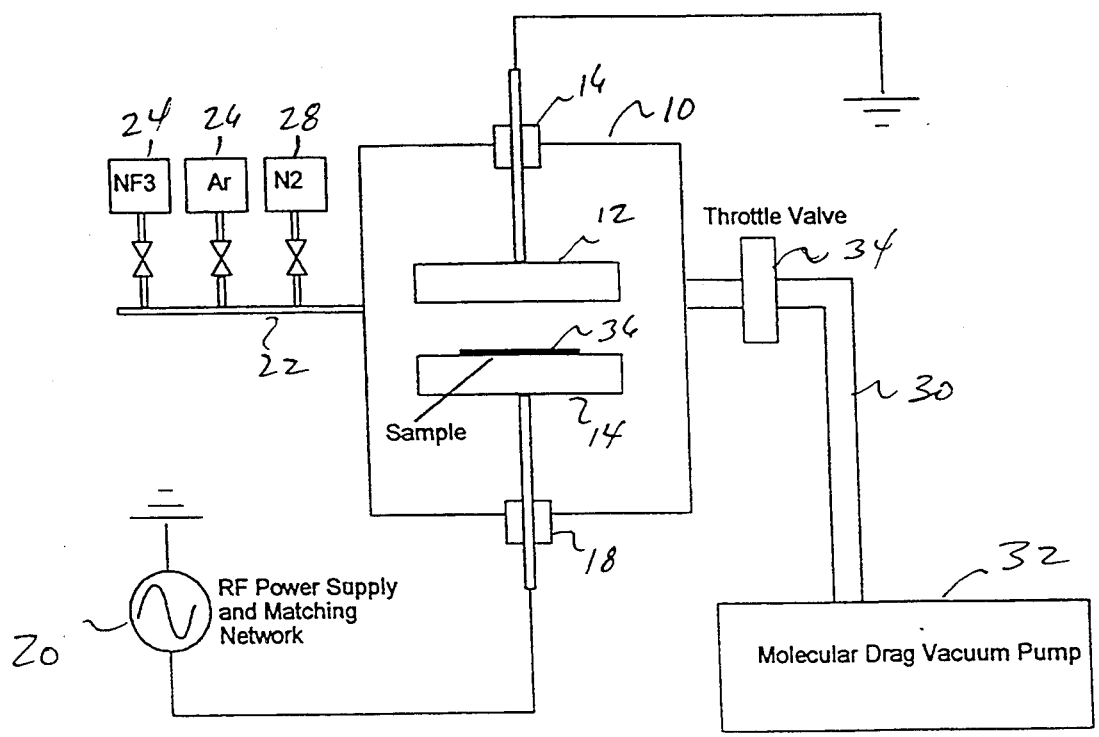
FIG. 1 is schematic of a preferred embodiment of the present invention.

Experiments were carried out in a small parallel plate plasma etching reactor 10 (see FIG. 1). The reactor is made of stainless steel with two 3 inch diameter stainless steel electrodes 12, 14, respectively, separated by one inch. The electrodes are electrically isolated from the reactor chamber wall by 2 inch ceramic offsets 16, 18. The 13.56 MHz RF power 20 is delivered to the bottom powered electrode 14 through two ¼" water cooling lines. The electrodes are maintained at approximately 25° C. by a circulating deionized water bath. The NF₃ (24), Ar (26) and N₂ (28) gases are delivered to the chamber through a common ¼" mixing line 22. The individual flowrates are metered by MKS Model 2159A mass flowcontrollers. The chamber is evacuated through 1.5" vacuum tubing 30 by a molecular drag (27 liter/sec.)—rough pump 32 combination. The base pressure of the chamber is $5.0 \times 10^{-7}$ torr. The operating pressure is measured using a capacitance manometer and is controlled using a flow restricting throttle valve 34. One inch square samples 36 are placed directly on the center of the bottom electrode 14. Etch rates are measured using HeNe laser interferometry for the $SiO_2$ and $Si_3N_4$ samples. The samples were comprised of silicon wafers coated in a PECVD reactor with a few microns of $SiO_2$ or $Si_3N_4$.

Table 1 shows the $SiO_2$ and $Si_3N_4$ etch rates for $NF_3$ mixed with a variety of diluents. These measurements were all taken at 1.4 W/cm², 550 mtorr, at 25% $NF_3$ in the diluent. The results show that the fastest etch rates are obtained using Ar or $N_2$. The present invention was characterized using Ar because it showed the fastest etch rate for $Si_3N_4$ and the second fastest for $SiO_2$. The process should be applicable to all the diluents studied.

TABLE 1

$SiO_2$ and $Si_3N_4$ etch rates in a $NF_3$ based plasmas. Conditions are 1.4 W/cm², 550 mTorr, 53 sccm total gas flowrate, 25% $NF_3$ in the diluent. The last entry is 100% $NF_3$.

| Mixture | $SiO_2$ Etch Rate (A/min) | $Si_3N_4$ Etch Rate (A/min) |
|---|---|---|
| $NF_3/Ar$ | 670 | 8000 |
| $NF_3/N_2$ | 860 | 7400 |
| $NF_3/He$ | 560 | 7400 |
| $NF_3/O_2$ | 520 | 5200 |
| $NF_3/N_2O$ | 280 | 3600 |
| $NF_3$ | 90 | 1000 |

Figure 2:
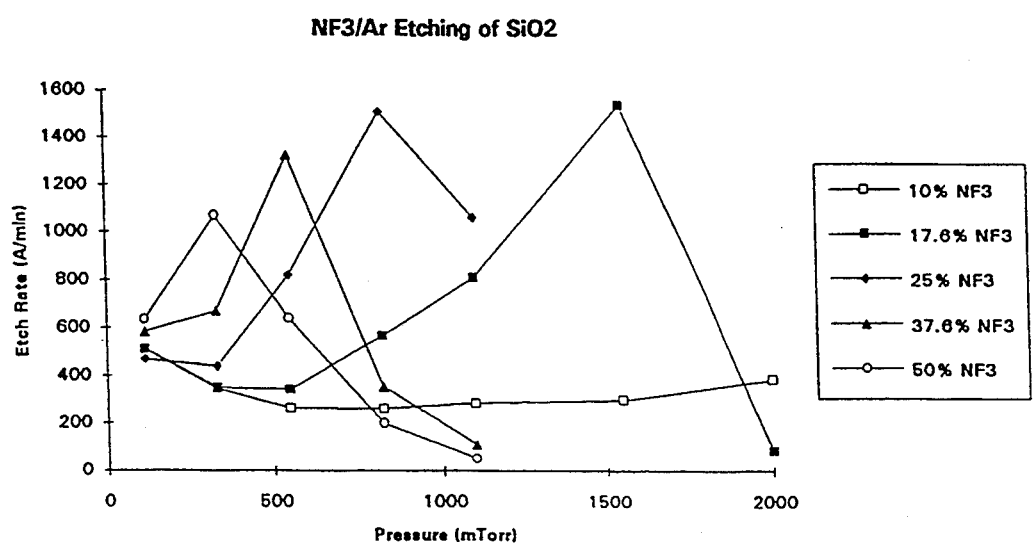
FIG. 2 is a graph of various concentrations of nitrogen trifluoride for etching silicon dioxide comparing etch rate against pressure obtained at 60 Watts (1.4 Watts/cm$^2$), 50 sccm total gas flowrate.

The etch rates for $SiO_2$ exposed to a variety of $NF_3$/Ar plasmas are plotted in FIG. 2. The series are different concentrations of $NF_3$ in Ar run at several different pressures. Each series shows a similar trend, the etch rate reaches a maximum and decreases at higher pressure, except for the 10% mixture. It is expected that the 10% blend would also reach a peak and decrease at higher pressures. The difference in the series is the pressure at which the maximum etch rate occurs. The maximum etch rate correlates with the $NF_3$ concentration, increasing with decreasing concentration. The highest etch rate observed, 1537 A/min. was obtained for the second lowest concentration of $NF_3$ investigated, approximately 18%.

Figure 3:
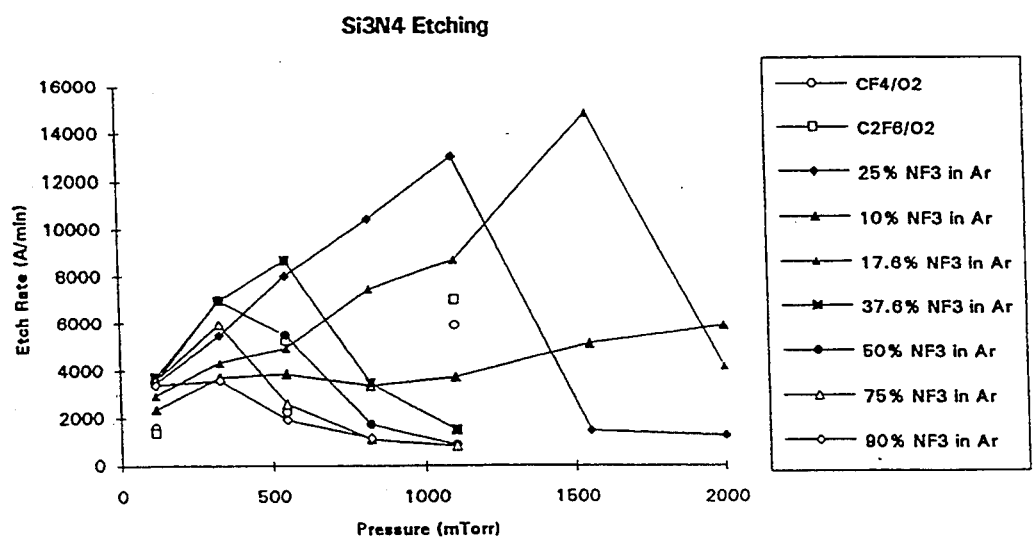
FIG. 3 is a graph of various concentrations of nitrogen trifluoride, CF$_4$ and C$_2$F$_6$ for etching silicon nitride comparing etch rate against pressure obtained at 60 Watts RF power, 50 sccm total gas flowrate.

A similar series of etch rate measurements taken from $Si_3N_4$ is plotted in FIG. 3. Again the same trend is observed, the etch rate achieves a maximum of 14,800 A/min at approximately 18% $NF_3$ in Ar at 1550 mtorr. Also shown in the figure are several $CF_4$/89% $O_2$ and $C_2F_6$/50% $O_2$ experiments, the major difference being the total gas flow of approximately 25 sccm. These concentrations were chosen to correspond with typical processes which might be used in the industry. This was done to show the increased etch rates for the $NF_3$ based plasmas.

The major advantage of the present invention is the unexpected enhancement in a method to etch-clean $SiO_2$ and $Si_3N_4$ at high etch rates using very low concentrations of $NF_3$. In the course of the investigation a preferred process window was characterized: 10–25% $NF_3$/Ar, at 600 to 1700 mtorr, 50 sccm total gas flow, 0.4–1.4 W/cm² which resulted in the highest etch rates for both films.

The unexpected result of the present invention is that $NF_3$, because of the highly electronegative nature of its discharge, must be controllably diluted with a more electropositive gas, preferably argon, and the plasma operated at a sufficiently high pressure to achieve the fastest etch rates. This is easily accomplished relative to the fluorocarbon based plasmas since they require an oxygen-containing diluent to prevent fluoropolymer deposition. The increased throughput, and lower gas consumption realized by the unique process window characterized by the present invention results in a economically advantageous process compared to the common alternatives.

Figure 4:
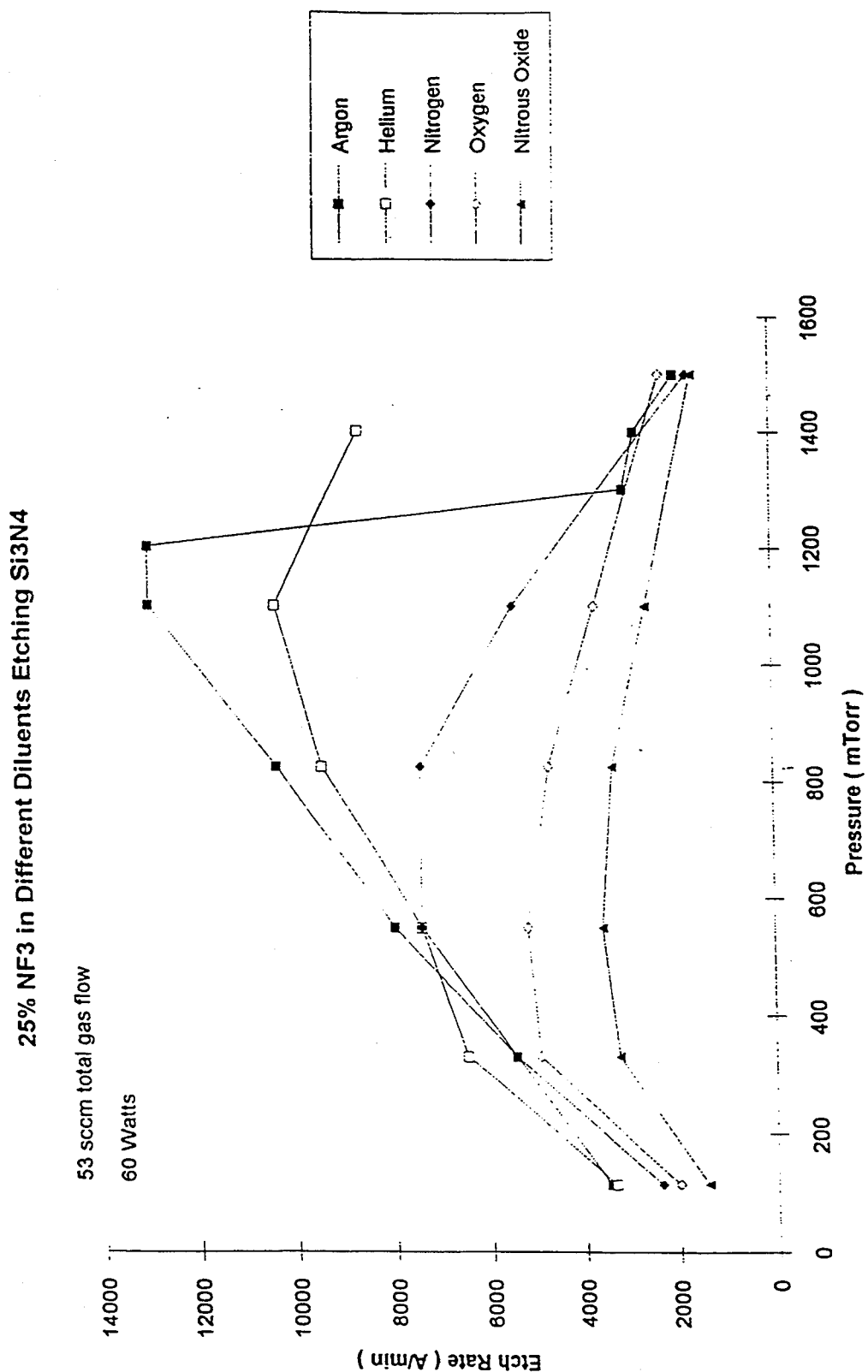
FIG. 4 is a graph of various diluents for a 25% concentration of nitrogen trifluoride for etching silicon nitride comparing etch rate against pressure obtained at 60 Watts, 53 sccm total gas flowrate.

Various diluents were also combined with nitrogen trifluoride to demonstrate that relatively low concentrations of nitrogen trifluoride have unexpectedly high etch rates when used with a diluent gas more electropositive than nitrogen trifluoride. This result is shown in FIG. 4 for argon, helium, nitrogen, oxygen and nitrous oxide with 25% nitrogen trifluoride.

This invention has the advantage of using less $NF_3$ than is currently thought necessary to achieve fast etch rates. The lower $NF_3$ concentrations and decreased etch or clean time results in an overall lower cost process.

The present invention has been set forth with regard to several specific embodiments, but the full scope of the invention should be ascertained from the claims which follow.

We claim:

1. A process for plasma etch-clean removal of films selected from the group consisting of silicon dioxide and silicon nitride which react with fluorine from a surface which comprises contacting said film with a plasma consisting essentially of approximately 10–25% nitrogen trifluoride in a diluent more electropositive than nitrogen trifluoride, at a pressure in the range of approximately 600–1700 mtorr, and a power in the range of approximately 0.4–1.4 W/cm².

2. The process of claim 1 wherein the diluent is selected from the group consisting of nitrogen, helium, argon, nitrous oxide and mixtures thereof.

3. The process of claim I wherein the nitrogen trifluoride is in the range of 10–18%.

4. The process of claim 1 wherein the pressure is approximately 800–1600 mtorr.

5. The process of claim 1 wherein the power is approximately 1.2 W/cm².

6. The process of claim 1 wherein the power is at a frequency approximately 13.56 MHz.

7. A process for plasma etch-clean removal of silicon dioxide film from a surface which comprises contacting a silicon dioxide film with a plasma consisting essentially of approximately 15–25% nitrogen trifluoride in argon, at a pressure in the range of approximately 700–1700 mtorr, and a power in the range of approximately 0.4–1.4 W/cm².

8. A process for plasma etch-clean removal of silicon nitride film from a surface which comprises contacting a silicon nitride film with a plasma consisting essentially of approximately 10–25% nitrogen trifluoride in argon, at a pressure in the range of approximately 700–1700 mtorr, and a power in the range of approximately 0.4–1.4 W/cm².

* * * * *